United States Patent
Su et al.

(10) Patent No.: US 7,460,368 B2
(45) Date of Patent: Dec. 2, 2008

(54) COOLING-FAN-FREE SYSTEM MODULE

(75) Inventors: Yo-Yo Su, Taipei County (TW); Mao-Chiang Chen, Taipei Hsien (TW)

(73) Assignee: Posiflex Inc., Taipei Hsien (TW)

( * ) Notice: Subject to any disclaimer, the term of this patent is extended or adjusted under 35 U.S.C. 154(b) by 41 days.

(21) Appl. No.: 11/617,701

(22) Filed: Dec. 28, 2006

(65) Prior Publication Data

US 2007/0258209 A1 Nov. 8, 2007

(30) Foreign Application Priority Data

May 4, 2006 (TW) ............................... 95207659 U

(51) Int. Cl.
*H05K 7/20* (2006.01)
*F28F 7/00* (2006.01)

(52) U.S. Cl. ...................... 361/690; 165/80.2; 165/185; 361/688; 361/715; 361/703

(58) Field of Classification Search .......... 361/688–690
See application file for complete search history.

(56) References Cited

U.S. PATENT DOCUMENTS

| | | | | |
|---|---|---|---|---|
| 4,980,848 A * | 12/1990 | Griffin et al. | ................ | 361/687 |
| 5,138,523 A * | 8/1992 | Benck et al. | ................ | 361/687 |
| 5,313,362 A * | 5/1994 | Hatada et al. | ................ | 361/709 |
| 5,424,913 A * | 6/1995 | Swindler | ................ | 361/687 |
| 5,440,450 A * | 8/1995 | Lau et al. | ................ | 361/695 |
| 5,923,084 A * | 7/1999 | Inoue et al. | ................ | 257/712 |
| 6,043,979 A * | 3/2000 | Shim | ................ | 361/695 |
| 6,101,095 A * | 8/2000 | Yamaguchi | ................ | 361/720 |
| 6,816,377 B2 * | 11/2004 | Itabashi et al. | ............ | 361/704 |
| 6,831,833 B2 * | 12/2004 | Kim et al. | ................ | 361/690 |
| 7,031,165 B2 * | 4/2006 | Itabashi et al. | ............ | 361/719 |
| 7,064,954 B1 * | 6/2006 | Wu et al. | ................ | 361/695 |
| 7,261,009 B2 * | 8/2007 | Saito et al. | ................ | 73/866.3 |

* cited by examiner

*Primary Examiner*—Gregory D Thompson
(74) *Attorney, Agent, or Firm*—Pai Patent & Trademark Law Firm; Chao-Chang David Pai

(57) ABSTRACT

A cooling-fan-free system module includes a housing unit, a circuit module, and a heat radiating unit. The housing unit includes a front and a rear case assembled together to define a receiving space therebetween, and the rear case is made of a highly heat conducting metal material. The circuit module is received in the receiving space of the housing unit, and includes a circuit board, and at least one heat-producing element mounted on and electrically connected to the circuit board. The heat radiating unit includes at least one insulating heat conductor bonded to an inner side of the rear case corresponding to the heat-producing element for transferring the heat produced by the heat-producing element to the rear case, and at least one heat radiating member integrally formed on a back side of the rear case and consisting of a plurality of radiating fins.

20 Claims, 6 Drawing Sheets

COOLING-FAN-FREE SYSTEM MODULE

RELATED APPLICATIONS

The present application is based on, and claims priority from, Taiwan Application Serial Number 95207659, filed May 4, 2006, the disclosure of which is hereby incorporated by reference herein in its entirety.

FIELD OF THE INVENTION

The present invention relates to a cooling-fan-free system module, and more particularly to a system module being provided with a heat radiating unit and convective circulation mechanism to achieve good heat radiating effect.

BACKGROUND OF THE INVENTION

The currently available system module usually includes a housing and a circuit module provided in the housing. The circuit module consists of a main board, and a plurality of electronic elements mounted on the main board, such as a central processing unit (CPU), a hard disk, a memory, and integrated circuits (IC's).

Since the electronic elements produce heat during operation thereof, vents and cooling fans are normally provided on the system module at proper positions corresponding to the heat-producing electronic elements to prevent the electronic elements from overheated to result in failure or abnormal operation of the system module.

Following disadvantages are found in the conventional system module which uses the cooling fan to carry away heat produced by the electronic elements during operation thereof:

(1) The cooling fan requires high manufacturing cost.
(2) The cooling fan occupies a large space to adversely affect good utilization of an inner space of the system module.
(3) The cooling fan tends to produce noise during operation thereof.
(4) The cooling fan tends to become failed after having been used over a long time.

SUMMARY OF THE INVENTION

It is therefore a primary object of the present invention to provide a cooling-fan-free system module that has lowered manufacturing cost and allows good applicability.

Another object of the present invention is to provide a cooling-fan-free system module that allows good utilization of an inner space thereof.

A further object of the present invention is to provide a cooling-fan-free system module that includes a noise-free and failure-free heat radiating unit.

To achieve the above and other objects, the cooling-fan-free system module according to the present invention includes a housing unit, a circuit module, and a heat radiating unit. The housing unit includes a front and a rear case assembled together to define a receiving space therebetween, and the rear case is made of a highly heat conducting metal material. The circuit module is received in the receiving space of the housing unit, and includes a circuit board, and at least one heat-producing element mounted and electrically connected to the circuit board. The heat radiating unit includes at least one insulating heat conductor bonded to an inner side of the rear case at a position corresponding to the heat-producing element for transferring the heat produced by the heat-producing element to the rear case, and at least one heat radiating member integrally formed on a back side of the rear case and consisting of a plurality of radiating fins.

The rear case is provided at a rear lower edge and a rear upper edge with a first and a second cutaway portion, respectively, to communicate the receiving space with an outer side of the housing unit. And, the circuit module further includes at least one signal transmission element mounted and electrically connected to the circuit board, and at least one bracket assembled to an inner lower side of the housing unit. The bracket is provided with at least one opening corresponding to the at least one signal transmission element, and at least one aperture communicating with the first and the second cutaway portion.

The second cutaway portion consists of a row of densely spaced vents.

The at least one insulating heat conductor is made of a flexible material.

The at least one heat-producing element is selected from the group consisting of a CPU, a hard disk, a memory, and an IC.

The rear case includes a first cover that is assembled to the front case and has a third cutaway portion, and a second cover that is detachably connected to and openably closes the third cutaway portion of the first cover.

The first cover further includes at least one locating mortise formed at an inner lateral edge of the third cutaway portion, and the second cover further includes at least one locating tenon corresponding to and adapted to engage with the locating mortise.

In a preferred embodiment of the present invention, the rear case is integrally provided on an inner side with at least one holding-down plate corresponding to the at least one heat-producing element. The at least one holding-down plate is raised from the inner side of the rear case, so as to press against the at least one insulating heat conductor for the same to more tightly contact with the at least one heat-producing element.

Alternatively, the at least one holding-down plate may be separately produced and then assembled to the inner side of the rear case to become raised therefrom.

The at least one insulating heat conductor may be bonded between the at least one holding-down plate and the rear case.

The rear case is also provided along a periphery thereof at proper positions with a plurality of ventilating holes.

The system module of the present invention further includes a display module; and both of the system module and the display module are mounted on a base.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
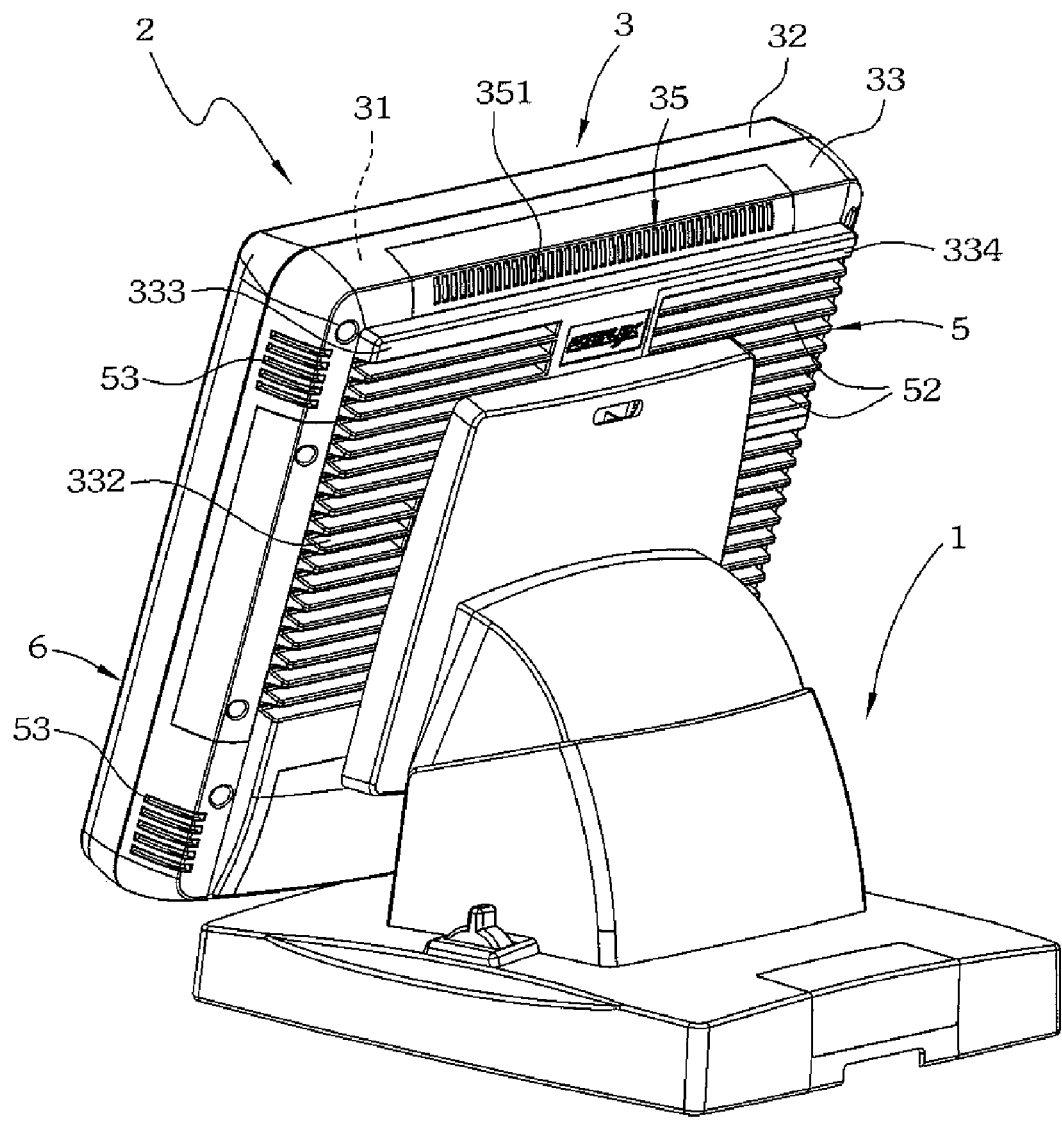
FIG. 1 is an assembled rear perspective view of a cooling-fan-free system module according to a preferred embodiment of the present invention mounted on a base.
Figure 2:
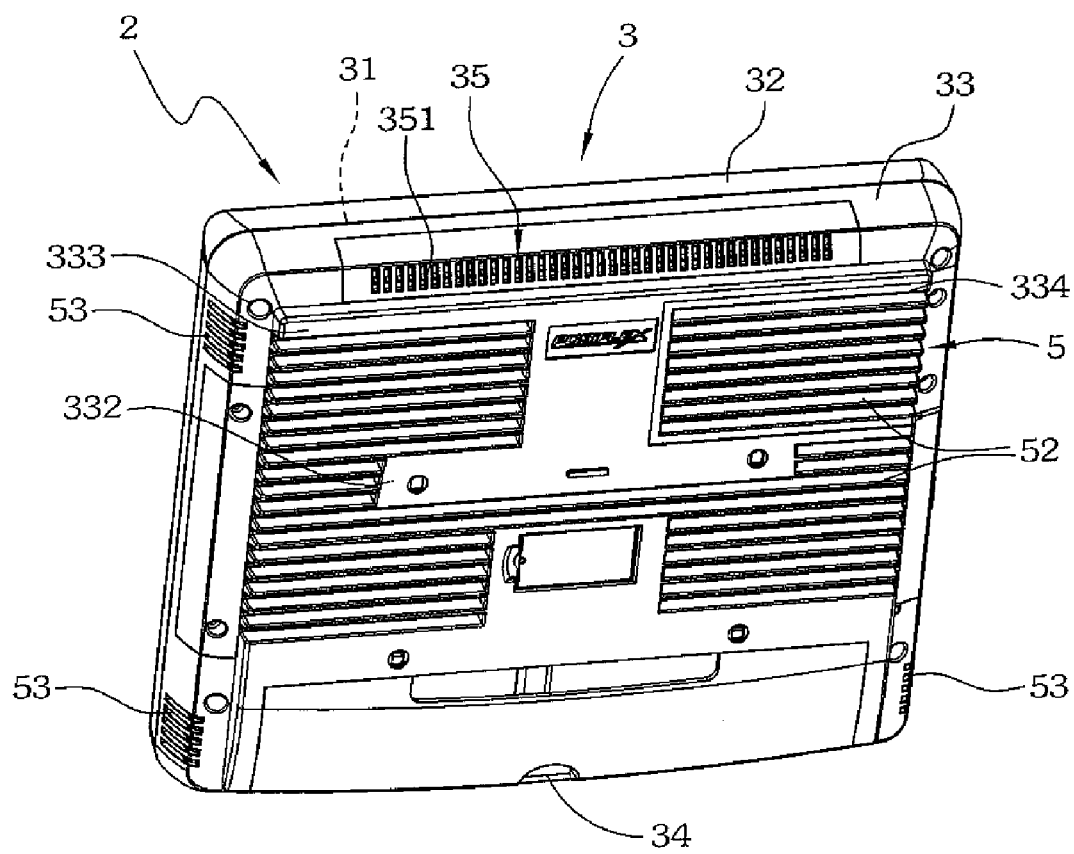
FIG. 2 is an assembled rear perspective view of the system module according to the preferred embodiment of the present invention.
Figure 3:
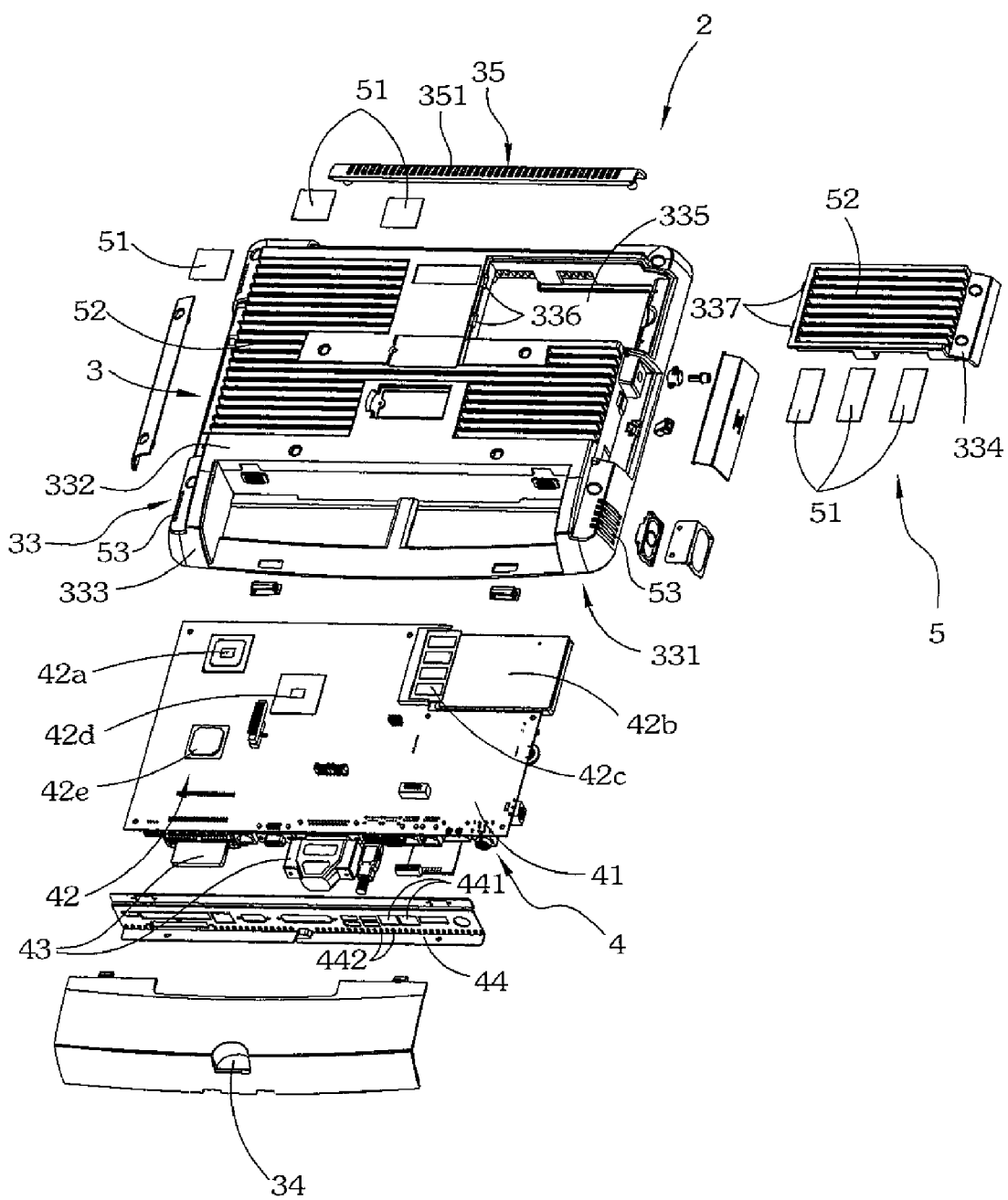
FIG. 3 is an exploded rear perspective view showing a housing unit, a circuit module, and a heat radiating unit of the system module of the present invention.
Figure 4:
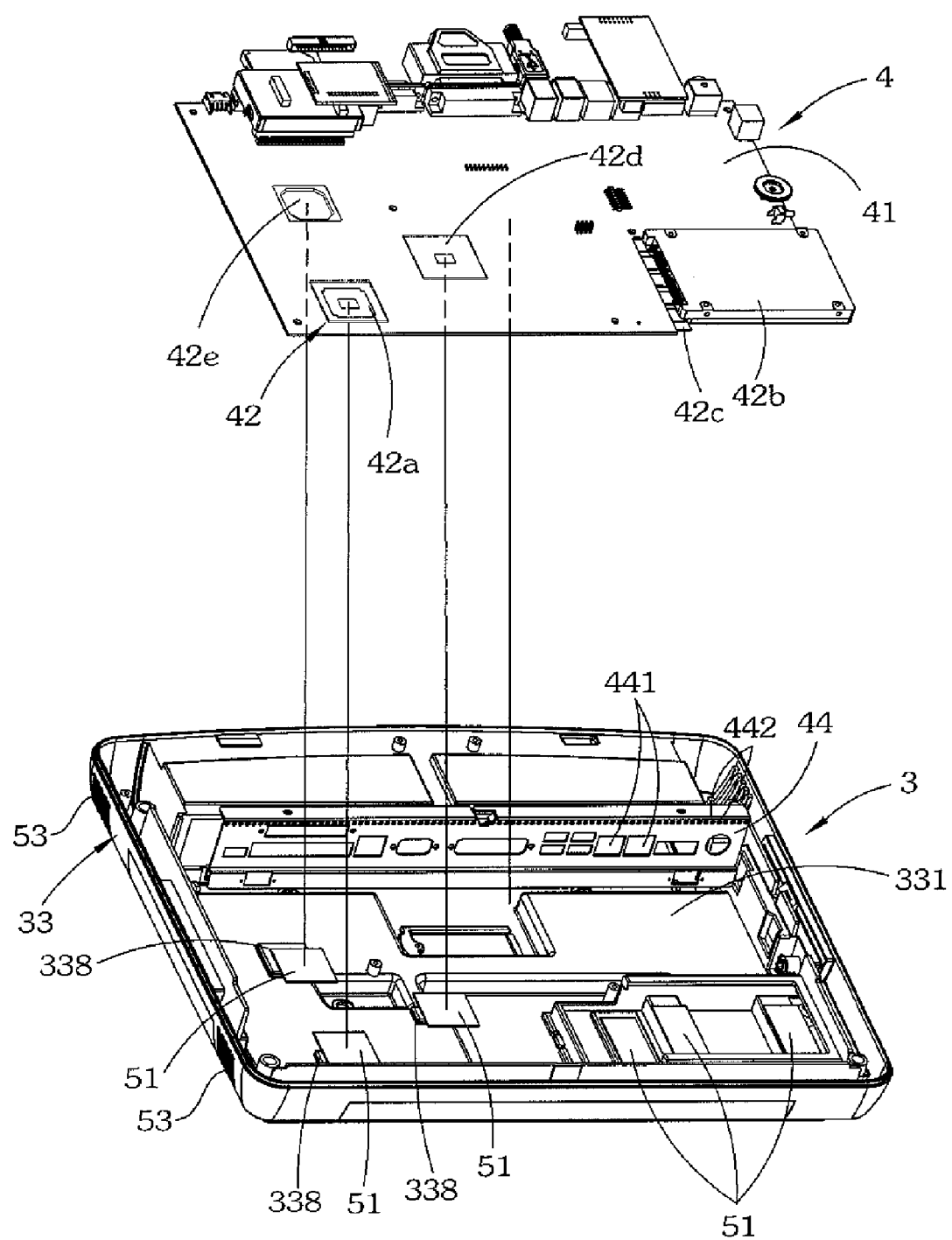
FIG. 4 is an exploded front perspective view showing three holding-down plates are provided in the system module according to the present invention.
Figure 5:
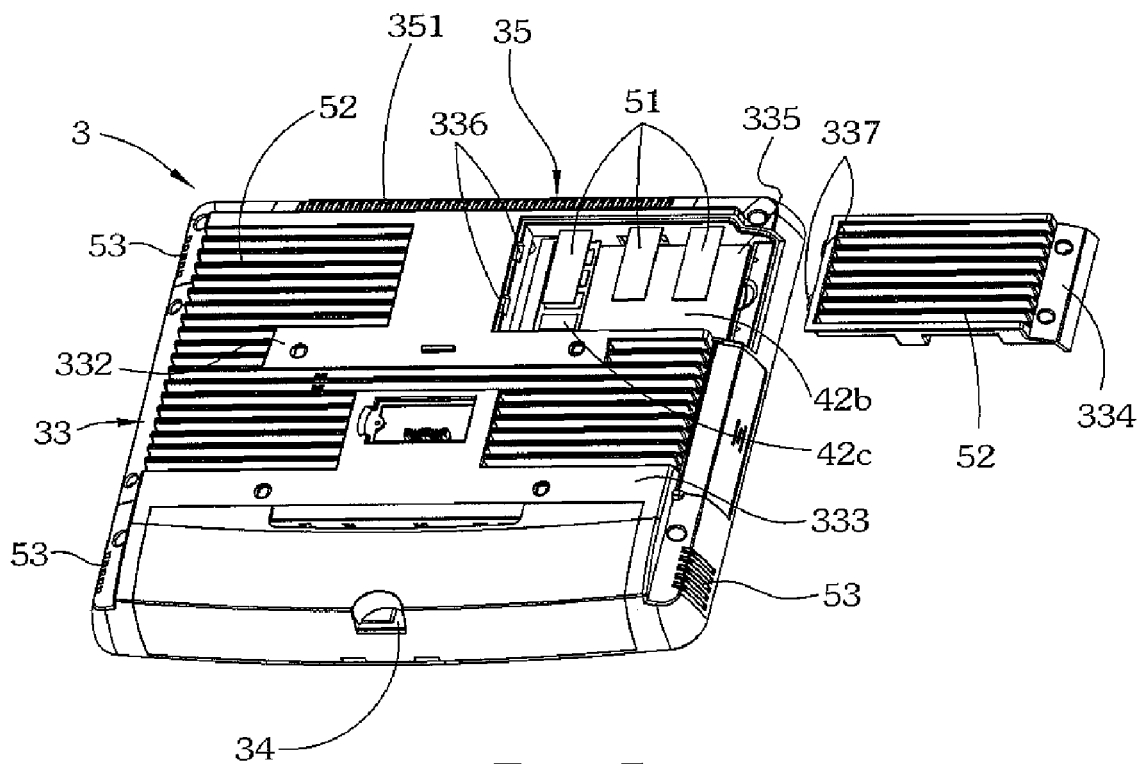
FIG. 5 is a rear perspective view of the system module of FIG. 2 with a second cover removed therefrom.

Please refer to FIG. 1 that is a rear perspective view of a cooling-fan-free system module 2 according to a preferred embodiment of the present invention, and to FIGS. 2 and 3 that are assembled and exploded rear perspective views, respectively, of the system module 2. As shown, the system module 2 includes a housing unit 3, a circuit module 4, and a heat radiating unit 5.

The housing unit 3 includes a front case 32 and a rear case 33, which are assembled together to define an internal receiving space 31 therebetween. The rear case 33 is made of a highly heat conducting metal material, such as aluminum, copper, or alloys thereof.

Please refer to FIGS. 2 to 5 at the same time. The circuit module 4 is located in the receiving space 31 defined by the housing unit 3, and includes a circuit board 41, and at least one heat-producing element 42 mounted on and electrically connected to one side of the circuit board 41 facing toward the rear case 33. The circuit module 4 further includes at least one signal transmission element 43 (see FIG. 3) mounted on and electrically connected to the circuit board 41, and a bracket 44 assembled to a lower inner side of the rear case 33 of the housing unit 3, such that the at least one signal transmission element 43 is outward extended from the circuit board 41 through the bracket 44 to be held in place. Herein, one side of the rear case 33 facing toward the at least one heat-producing element 42 is defined as an inner side 331 of the rear case 33, and another side of the rear case 33 facing away from the at least one heat-producing element 42 is defined as a back side 332 of the rear case 33. In the illustrated preferred embodiment of the present invention, there are five heat-producing elements 42 provided on the circuit board 41, namely, a central processing unit (CPU) 42a, a hard disk 42b, a memory 42c, and two integrated circuits (IC's) 42d, 42e.

The bracket 44 is provided with at least one opening 441 to communicate spaces above and below the bracket 44.

An exact number and shape of the opening 441 is correspondent to that of the signal transmission element 43, so that the signal transmission element 43 may be outward extended from the circuit board 41 through the corresponding opening 441 and firmly held thereto. In the illustrated preferred embodiment of the present invention, the at least one signal transmission element 43 may be a universal serial bus (USB), an audio/video (AV) terminal, or a PS2 port. The bracket 44 is further provided with a plurality of apertures 442 communicating spaces above and below the bracket 44.

In the illustrated preferred embodiment of the present invention, the hard disk 42b and the memory 42c are removably connected to the circuit board 41 to enable convenient and easy replacement thereof. And, the rear case 33 is divided into a first cover 333, which is assembled to the front case 32 and having a third cutaway portion 335 at a position corresponding to the hard disk 42b and the memory 42c; and a second cover 334, which is detachably connected to the first cover 333 at the third cutaway portion 335 to openably close the latter. The third cutaway portion 335 is further provided at a lateral inner edge with at least one locating mortise 336, and the second cover 334 is further provided with at least one locating tenon 337 corresponding to the at least one locating mortise 336, so that the second cover 334 is removably connected to the first cover 333 to openably close the third cutaway portion 335 and form a complete rear case 33 via engagement of the at least one locating tenon 337 with the at least one locating mortise 336. When it is desired to remove the hard disk 42b or the memory 42c from the circuit board 41, simply disengage the locating tenon 337 of the second cover 334 from the locating mortise 336 of the first cover 333.

In the present invention, heat produced by the heat-producing elements 42 during operation thereof is carried away from the cooling-fan-free system module 2 through convective circulation and radiative heat transfer. To carry away heat through convection circulation, the first cover 333 of the rear case 33 is formed at a rear lower edge with a first cutaway portion 34, and at a rear upper edge with a second cutaway portion 35 substantially corresponding to the first cutaway portion 34. Both the first and the second cutaway portion 34, 35 are communicable with the apertures 442 on the bracket 44. In the illustrated preferred embodiment of the present invention, the second cutaway portion 35 actually consists of a row of densely spaced vents 351. When the heat-producing elements 42 operate and produce heat, they exchange heat with ambient cold air. Hot air in the receiving space 31 of the system module 2 moves upward and is released from the second cutaway portion 35 at the rear upper edge of the rear case 33, and cold air moves into the receiving space 31 via the first cutaway portion 34 at the rear lower edge of the rear case 33 and the apertures 442 on the bracket 44 to replenish the air in the receiving space 31, and to further exchange heat with the heat-producing elements 42. When the convective circulation continues, heat produced by the heat-producing elements 42 may be effectively carried away from the system module 2.

To carry away heat through radiative heat transfer, the heat radiating unit 5 is provided. The heat radiating unit 5 includes six insulating heat conductors 51 for transferring heat produced by the heat-producing elements 42 to the rear case 33, and two heat radiating members 52 for dissipating the heat transferred to and absorbed by the rear case 33 into air.

Four of the six insulating heat conductors 51 are independently bonded between the rear case 33 and the CPU 42a, the memory 42c, and the two IC's 42d, 42e, while the other two are correspondingly located between the rear case 33 and the hard disk 42b. In the illustrated preferred embodiment, the insulating heat conductors 51 are made of an electrically insulating and thermally conductive flexible material, such as silicon rubber, and are fixedly bonded to and between the rear case 33 and the heat-producing elements 42 using double-side adhesive tape, for example. And, to reduce material cost, the insulating heat conductors 51 are independently cut to an appropriate area before being attached to the corresponding heat-producing elements 42. However, it is understood that the number of the insulating heat conductors 51 may be changed with different cut sizes thereof, and is not limited to six as illustrated in the preferred embodiment of the present invention.

Each of the heat radiating members 52 includes a plurality of radiating fins, and is integrally formed at the back side 332 of the first cover 333 and the second cover 334 of the rear case 33, that is, at the side of the rear case 33 facing away from the circuit module 4.

When the heat-producing elements 42 produce heat during operation thereof, the produced heat is transferred via the insulating heat conductors 51 to the rear case 33 and the heat radiating members 52 to dissipate into ambient air, so that the heat-producing elements 42 are prevented from having exceeded working temperature.

The rear case 33 is further provided along a periphery thereof at proper positions with a plurality of ventilating holes 53, via which heat produced by the heat-producing elements 42 may also be dissipated into ambient air to enable increased heat radiating effect.

Figure 6:
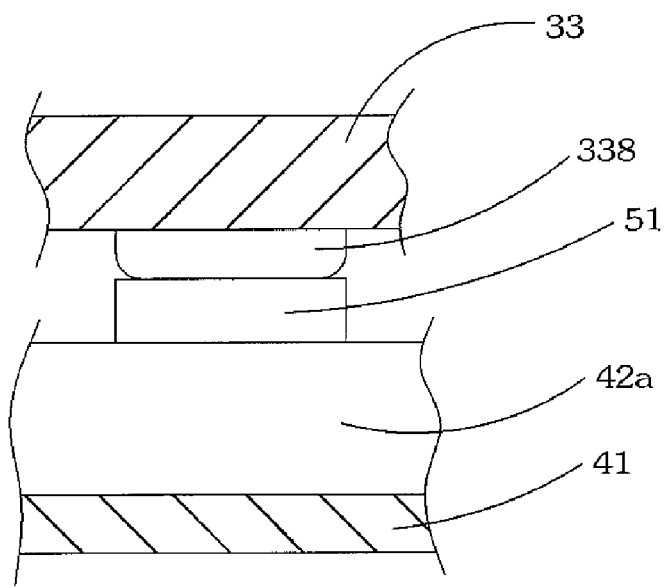
FIG. 6 is a fragmentary, enlarged sectional view showing a first embodiment of the holding-down plate in the system module of the present invention for pressing an insulating heat conductor against a heat-producing element.

Please refer to FIG. 6. To enable a firm bonding of the insulating heat conductors 51 to and between the rear case 33 and the heat-producing elements 42, a holding-down plate 338 may be provided at the inner side 331 of the rear case 33 corresponding to each of the heat-producing elements 42. The holding-down plates 338 are raised from the inner side 331 of the rear case 33, so as to press against the insulating heat conductors 51 for the latter to more tightly contact with the heat-producing elements 42. There are three holding-down plates 338 provided in the illustrated preferred embodiment to separately correspond to the CPU 42a, and the two IC's 42d, 42e. However, it is understood that the number of the holding-down plates 338 may be increased or decreased depending on actual need in design.

Figure 7:
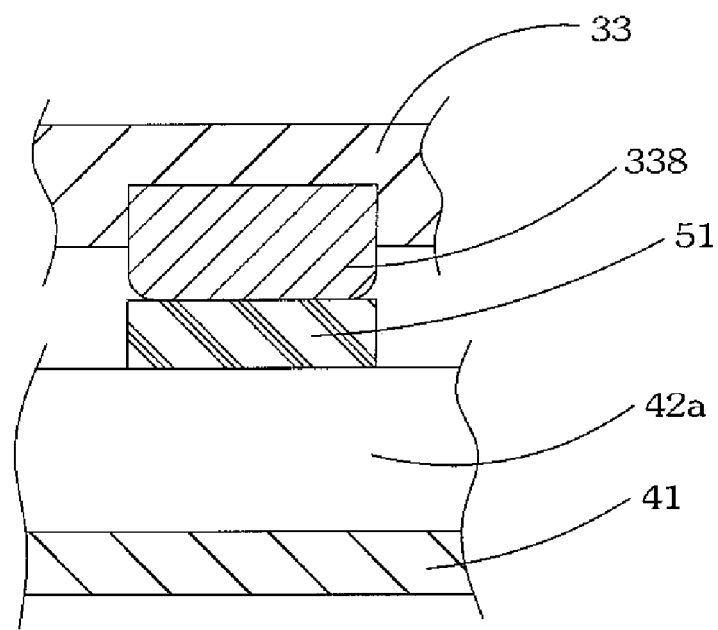
FIG. 7 is a fragmentary, enlarged sectional view showing a second embodiment of the holding-down plate in the system module of the present invention for pressing an insulating heat conductor against a heat-producing element.

In FIG. 6, the holding-down plates 338 are integrally formed on the rear case 33. However, the holding-down plates 338 may be otherwise separately formed and then assembled to the rear case 33 to become raised therefrom, as shown in FIG. 7. The holding-down plates 338 may have a size and thickness determined according to the amount of heat produced by the heat-producing elements 42. In the structure as shown in FIG. 7, the holding-down plates 338 may be made of a material with even higher thermal conductivity, so that heat produced by the heat-producing elements 42 may be more quickly transferred via the holding-down plates 338 to the rear case 33 and dissipated into air to achieve an upgraded heat radiation efficiency.

Figure 8:
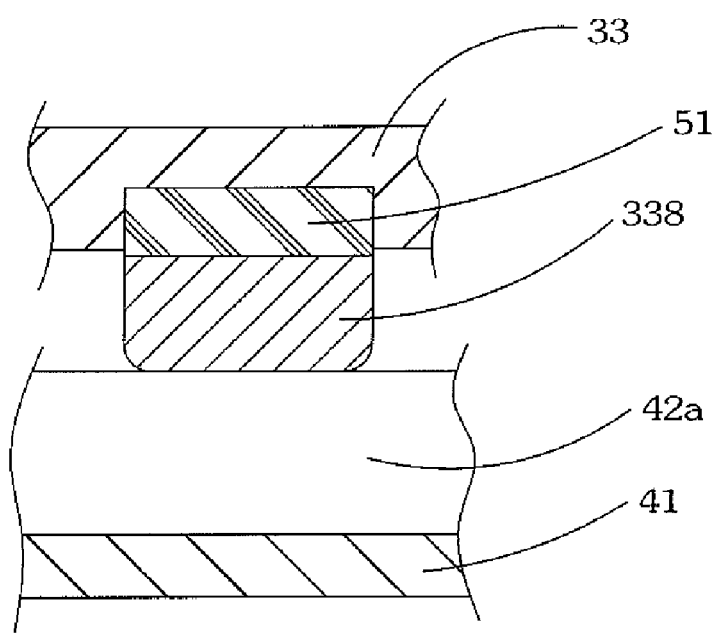
FIG. 8 is a fragmentary, enlarged sectional view showing a third embodiment of the holding-down plate in the system module of the present invention.

Please refer to FIG. 8 in which another embodiment of the holding-down plates 338 is illustrated. In this embodiment, the holding-down plates 338 are independently produced, and the insulating heat conductors 51 are bonded between the holding-down plates 338 and the rear case 33, while the highly thermally conductive holding-down plates 338 are in direct contact with the heat-producing elements 42 to absorb heat produced by the latter. The heat absorbed by the holding-down plates 338 is then transferred via the insulating heat conductors 51 to the rear case 33.

Please refer to FIG. 1 again. The system module 2 further includes a display module 6, and both of the system module 2 and the display module 6 are mounted on a base 1, so that a user may conveniently watch the display module 6.

With the above arrangements, the cooling-fan-free system module according to the present invention does not require any additionally mounted heat radiating unit. Instead, with the first cutaway portion 34, the apertures 442, and the second cutaway portion 35 that together constitute a convective circulation mechanism, and the heat radiating members 52 integrally formed on the rear case 33 and containing a plurality of radiating fins that cooperate with the insulating heat conductors 51 to transfer heat produced by the heat-producing elements 42, heat may be highly efficiently carried away from the system module 2 at reduced cost, without producing any noise, and free of mechanical failure. Moreover, the insulating heat conductors 51 occupy only a very small space, allowing a user to effectively utilize the receiving space 31 in the housing unit 3. The holding-down plates 338 provided in the cooling-fan-free system module 2 enable the insulating heat conductors 51 to be firmly and tightly bonded between and pressed against the heat-producing elements 42 and the rear case 33, or to be firmly and tightly bonded between and pressed against the rear case 33 and the holding-down plates 338, which are in direct contact with the heat-producing elements 42, so as to ensure good heat radiating effect.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A cooling-fan-free system module, comprising:
a housing unit including a front case and a rear case assembled together to define a receiving space therebetween, said rear case being made of a highly heat conducting metal material and having an inner side facing toward said receiving space and a back side facing away from said receiving space;
a circuit module received in said receiving space, said circuit module including a circuit board, and at least one heat-producing element mounted on and electrically connected to one side of said circuit board facing toward said inner side of said rear case; and
a heat radiating unit including at least one insulating heat conductor bonded to said inner side of said rear case at a position corresponding to said at least one heat-producing element, so as to transfer heat produced by said at least one heat-producing element to said rear case, and at least one heat radiating member integrally formed on said back side of said rear case and consisting of a plurality of radiating fins,
wherein said rear case is further provided at a rear lower edge and a rear upper edge with a first and a second cutaway portion, respectively, to communicate said receiving space with an outer side of said housing unit; and
wherein said circuit module further includes at least one signal transmission element mounted on and electrically connected to said circuit board, and at least one bracket assembled to an inner lower side of said housing unit: said bracket being provided with at least one opening corresponding to said at least one signal transmission element, and at least one aperture communicating with said first and said second cutaway portion.

2. The cooling-fan-free system module as claimed in claim 1, wherein said second cutaway portion consists of a row of densely spaced vents.

3. The cooling-fan-free system module as claimed in claim 1, wherein said at least one insulating heat conductor is made of a flexible material.

4. The cooling-fan-free system module as claimed in claim 1, wherein said at least one heat-producing element is selected from the group consisting of a CPU, a hard disk, a memory, and an IC.

5. The cooling-fan-free system module as claimed in claim 1, wherein said rear case includes a first cover that is assembled to said front case and has a third cutaway portion, and a second cover that is detachably connected to and openably closes said third cutaway portion of said first cover.

6. The cooling-fan-free system module as claimed in claim 5, wherein said first cover further includes at least one locating mortise formed at an inner lateral edge of said third cutaway portion, and said second cover further includes at least one locating tenon corresponding to and adapted to engage with said at least one locating mortise.

7. The cooling-fan-free system module as claimed in claim 1, wherein said inner side of said rear case is provided with at least one holding-down plate corresponding to said at least one heat-producing element, and said at least one insulating heat conductor is bonded to said at least one holding-down plate of said inner side of said rear case, said at least one holding-down plate being raised from said inner side of said rear case, so as to press against said at least one insulating heat conductor for the same to more tightly contact with said at least one heat-producing element.

8. The cooling-fan-free system module as claimed in claim 7, wherein said at least one holding-down plate is separately produced and then assembled to said inner side of said rear case to become raised therefrom.

9. The cooling-fan-free system module as claimed in claim 1, further comprising at least one separately produced holding-down plate assembled to and raised from said at least one insulating heat conductor to be in direct contact with said at least one heat-producing element.

10. The cooling-fan-free system module as claimed in claim 1, wherein said rear case is provided along a periphery thereof at predetermined positions with a plurality of ventilating holes.

11. The cooling-fan-free system module as claimed in claim 1, further comprising a display module.

12. A cooling-fan-free system module, comprising:
- a housing unit including a front case and a rear case assembled together to define a receiving space therebetween, said rear case being made of a highly heat conducting metal material and having an inner side facing toward said receiving space and a back side facing away from said receiving space;
- a circuit module received in said receiving space, said circuit module including a circuit board, and at least one heat-producing element mounted on and electrically connected to one side of said circuit board facing toward said inner side of said rear case; and
- a heat radiating unit including at least one insulating heat conductor bonded to said inner side of said rear case at a position corresponding to said at least one heat-producing element, so as to transfer heat produced by said at least one heat-producing element to said rear case, and at least one heat radiating member integrally formed on said back side of said rear case and consisting of a plurality of radiating fins, wherein said rear case includes a first cover that is assembled to said front case and has a third cutaway portion, and a second cover that is detachably connected to and openably closes said third cutaway portion of said first cover.

13. The cooling-fan-free system module as claimed in claim 12, wherein said first cover further includes at least one locating mortise formed at an inner lateral edge of said third cutaway portion, and said second cover further includes at least one locating tenon corresponding to and adapted to engage with said at least one locating mortise.

14. The cooling-fan-free system module as claimed in claim 12, wherein said inner side of said rear case is provided on with at least one holding-down plate corresponding to said at least one heat-producing element, and said at least one insulating heat conductor is bonded to said at least one holding-down plate of said inner side of said rear case, said at least one holding-down plate being raised from said inner side of said rear case, so as to press against said at least one insulating heat conductor for the same to more tightly contact with said at least one heat-producing element.

15. The cooling-fan-free system module as claimed in claim 14, wherein said at least one holding-down plate is separately produced and then assembled to said inner side of said rear case to become raised therefrom.

16. The cooling-fan-free system module as claimed in claim 12, further comprising at least one separately produced holding-down plate assembled to and raised from said at least one insulating heat conductor to be in direct contact with said at least one heat-producing element.

17. The cooling-fan-free system module as claimed in claim 12, wherein said rear case is provided along a periphery thereof at predetermined positions with a plurality of ventilating holes.

18. The cooling-fan-free system module as claimed in claim 12, further comprising a display module.

19. The cooling-fan-free system module as claimed in claim 12, wherein said at least one insulating heat conductor is made of a flexible material.

20. The cooling-fan-free system module as claimed in claim 12, wherein said at least one heat-producing element is selected from the group consisting of a CPU, a hard disk, a memory, and an IC.

* * * * *